US010339446B2

United States Patent
Lee

(10) Patent No.: US 10,339,446 B2
(45) Date of Patent: Jul. 2, 2019

(54) NEUROMORPHIC DEVICE

(71) Applicant: SK hynix Inc., Icheon (KR)

(72) Inventor: Hyung-Dong Lee, Hwaseong (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/969,680

(22) Filed: May 2, 2018

(65) Prior Publication Data

US 2018/0247946 A1 Aug. 30, 2018

Related U.S. Application Data

(63) Continuation of application No. 15/394,548, filed on Dec. 29, 2016, now abandoned.
(Continued)

(30) Foreign Application Priority Data

Dec. 6, 2016 (KR) .................. 10-2016-0165000

(51) Int. Cl.
| | |
|---|---|
| *H01L 45/00* | (2006.01) |
| *G06N 3/063* | (2006.01) |
| *H01L 27/11519* | (2017.01) |
| *H01L 27/11556* | (2017.01) |
| *G11C 11/54* | (2006.01) |
| *G11C 16/04* | (2006.01) |
| *G11C 16/10* | (2006.01) |
| *H01L 21/28* | (2006.01) |

(Continued)

(52) U.S. Cl.
CPC ............ *G06N 3/063* (2013.01); *G11C 11/54* (2013.01); *G11C 16/0416* (2013.01); *G11C 16/10* (2013.01); *H01L 21/28291* (2013.01); *H01L 27/11519* (2013.01); *H01L 27/11556* (2013.01); *H01L 27/11582* (2013.01); *H01L 29/7926* (2013.01); *H01L 21/28282* (2013.01); *H01L 29/7889* (2013.01); *H01L 45/04* (2013.01); *H01L 45/06* (2013.01); *H01L 45/141* (2013.01); *H01L 45/146* (2013.01); *H01L 45/147* (2013.01)

(58) Field of Classification Search
CPC ............ G06N 3/063; H01L 27/11582; H01L 29/7926; H01L 21/28291; H01L 27/11556; H01L 27/11519; H01L 45/06; H01L 45/04; H01L 45/146; H01L 21/28282; H01L 45/147; H01L 29/7889; H01L 45/141; G11C 16/0416; G11C 16/10; G11C 11/54
See application file for complete search history.

(56) References Cited

U.S. PATENT DOCUMENTS

| | | |
|---|---|---|
| 5,264,734 A | 11/1993 | Holler et al. |
| 5,353,382 A | 10/1994 | Yariv et al. |

(Continued)

*Primary Examiner* — David Vu

(57) ABSTRACT

A neuromorphic device may include: a plurality of row lines extending in a first direction; a plurality of additional row lines extending in the first direction; a plurality of column lines extending in a second direction that crosses the first direction; and a plurality of synapses positioned at intersections of the row lines, the additional row lines, and the column lines, wherein each of the synapses includes a transistor comprising a floating gate, a control gate insulated from the floating gate, a first junction, and a second junction, the control gate being coupled to a corresponding one of the plurality of row lines, the first junction being coupled to a corresponding one of the plurality of additional row lines, the second junction being coupled to a corresponding one of the plurality of column lines.

13 Claims, 14 Drawing Sheets

Related U.S. Application Data

(60) Provisional application No. 62/273,295, filed on Dec. 30, 2015.

(51) Int. Cl.
*H01L 29/792* (2006.01)
*H01L 27/11582* (2017.01)
*H01L 29/788* (2006.01)

(56) References Cited

U.S. PATENT DOCUMENTS 6,023,422 A    2/2000  Allen et al.
7,893,483 B2   2/2011  Kinoshita et al.

NEUROMORPHIC DEVICE

CROSS-REFERENCE TO RELATED APPLICATIONS

The present application is a continuation of U.S. patent application Ser. No. 15/394,548, filed Dec. 29, 2016, which claims priority to U.S. Provisional Patent Application No. 62/273,295, filed on Dec. 30, 2015, and to Korean Patent Application No. 10-2016-0165000, filed on Dec. 6, 2016, which are incorporated herein by reference in their entirety.

BACKGROUND

1. Field

Exemplary embodiments of the present disclosure relate to neuromorphic devices that mimic a human nervous system, and their applications.

2. Description of the Related Art

Recently, as electronic appliances trend toward miniaturization, low power consumption, high performance, multi-functionality, and so on, technology capable of efficiently processing large-volume information has been demanded. In particular, neuromorphic technology for mimicking neurobiological architectures present in a human nervous system has received much attention to implement the technology of efficiently processing large-volume information. The human nervous system includes several thousand billions of neurons and synapses serving as junctions between the respective neurons. In the neuromorphic technology, neuron circuits and synapse circuits, which correspond to neurons and synapses of the human nervous system, respectively, are designed to realize neuromorphic devices. The neuromorphic devices may be used in various applications including data classification, pattern recognition, and the like.

SUMMARY

Embodiments of the present disclosure are directed to a neuromorphic device having enhanced accuracy of learning and recognition.

In accordance with an embodiment, a neuromorphic device includes a plurality of row lines extending in a first direction; a plurality of additional row lines extending in the first direction; a plurality of column lines extending in a second direction that crosses the first direction; and a plurality of synapses positioned at intersections of the row lines, the additional row lines, and the column lines, wherein each of the synapses includes a transistor comprising a floating gate, a control gate insulated from the floating gate, a first junction, and a second junction, the control gate being coupled to a corresponding one of the plurality of row lines, the first junction being coupled to a corresponding one of the plurality of additional row lines, the second junction being coupled to a corresponding one of the plurality of column lines.

In the above embodiment, the plurality of row lines receive voltage pulses corresponding to certain data. A threshold voltage of the transistor decreases when a certain charge is trapped in the floating gate. An amount of the charge trapped in the floating gate increases when a number of the voltage pulses received by the plurality of row lines increases. The threshold voltage of the transistor decreases when a number of the voltage pulses received by the plurality of row lines increases. A current flow between the first junction and the second junction increases when a number of the voltage pulses received by the plurality of row lines increases. The plurality of additional row lines receives a voltage having the same polarity as the voltage pulses received by the plurality of row lines. The voltage received by the plurality of additional row lines has the same magnitude as the voltage pulses received by the plurality of row lines. Each of the plurality of column lines learns different data. In a process of a first one of the plurality of column lines learning the certain data, a second one of the plurality of column lines is in a floating state, the second column line being learned.

In accordance with another embodiment, a neuromorphic device includes a substrate; a lower line disposed over the substrate, the lower line extending in a first direction; an upper line disposed over the lower line, the upper line extending in a second direction that crosses the first direction; a semiconductor pillar positioned between the lower line and the upper line in an intersection region between the lower line and the upper line; a tunnel insulating layer, a floating gate, and a charge blocking layer sequentially encircling the semiconductor pillar, the tunnel insulating layer being disposed against a side surface of the semiconductor pillar; and a control gate encircling the charge blocking layer, being disposed against a side surface of the charge blocking layer, and extending in the first direction or the second direction, wherein a synapse includes the semiconductor pillar, the tunnel insulating layer, the floating gate, the charge blocking layer, and the control gate.

In the above embodiment, the control gate receives voltage pulses corresponding to certain data. An electrical conductivity of the synapse increases when a certain charge is trapped in the floating gate. An amount of the charge trapped in the floating gate increases when a number of the voltage pulses received by the control gate increases. The electrical conductivity of the synapse increases when a number of the voltage pulses received by the control gate increases. A current flow passing through the semiconductor pillar increases as a number of the voltage pulses received by the control gate increases. One of the lower line and the upper line receives a voltage having the same polarity as the voltage pulses applied to the control gate. The voltage applied to the one of the lower line and the upper line has the same magnitude as the voltage pulses applied to the control gate. The other of the lower line and the upper line learns the certain data.

DETAILED DESCRIPTION

Figure 1A:
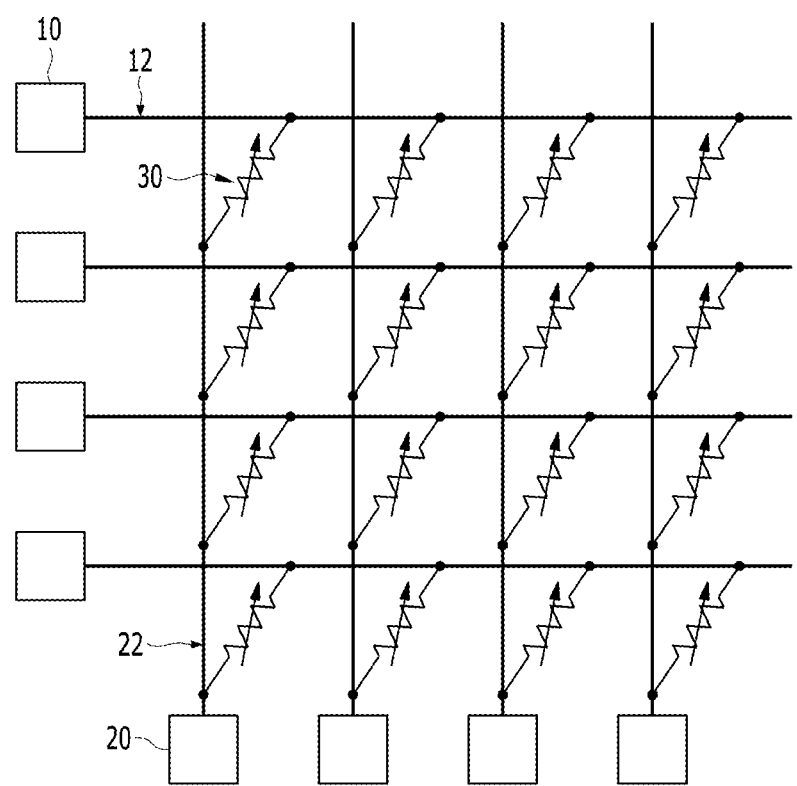
FIG. 1A is a view illustrating a neuromorphic device according to a comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Prior to describing an embodiment, a neuromorphic device of a comparative example, an operating method of the neuromorphic device, and a problem of the neuromorphic device will be described.

Figure 1B:
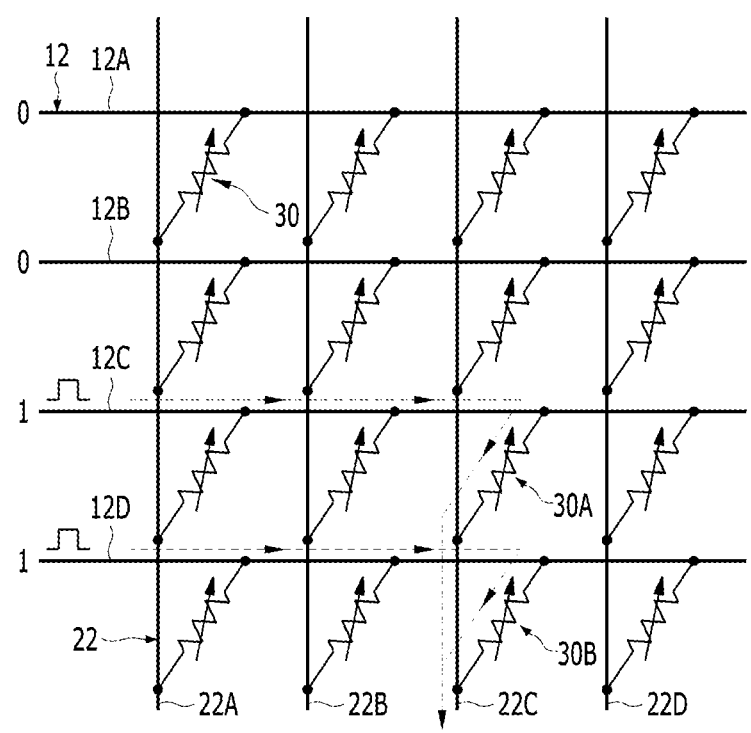
FIGS. 1B and 1C are views illustrating an example of an operating method of the neuromorphic device of FIG. 1A.
Figure 1C:
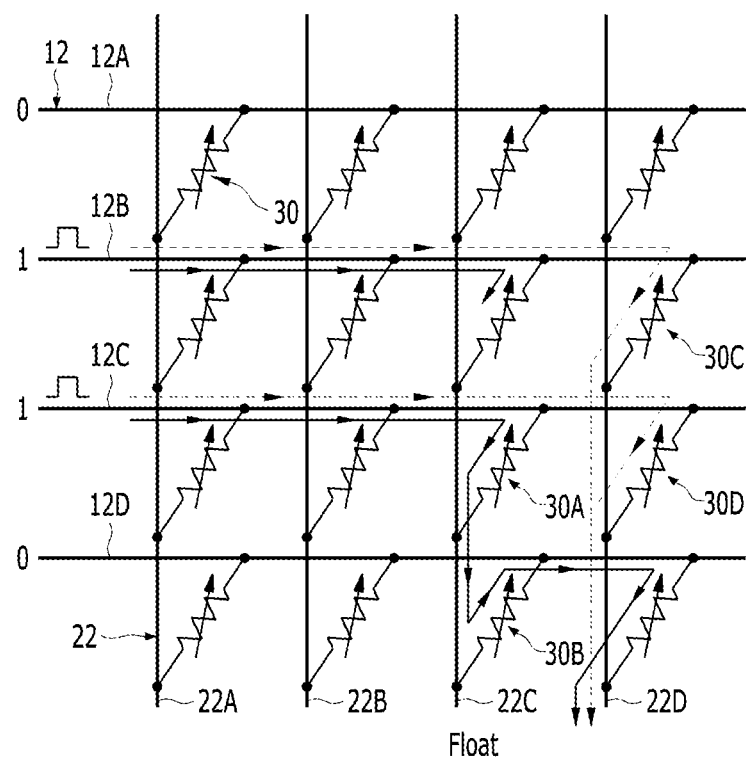

FIG. 1A is a view illustrating a neuromorphic device according to a comparative example, and FIGS. 1B and 1C are views illustrating an example of an operating method of the neuromorphic device of FIG. 1A.

Referring to FIG. 1A, the neuromorphic device according to the comparative example may include a plurality of pre-synaptic neurons 10, a plurality of post-synaptic neurons 20, and a plurality of synapses 30 that provide connections between the plurality of pre-synaptic neurons 10 and the plurality of post-synaptic neurons 20.

For illustrative convenience, the neuromorphic device shown in FIG. 1A includes four pre-synaptic neurons 10, four post-synaptic neurons 20, and sixteen synapses 30, but the numbers of pre-synaptic neurons, post-synaptic neurons, and synapses in the neuromorphic device may be changed in various ways. If the number of pre-synaptic neurons 10 is N and the number of post-synaptic neurons 20 is M, N*M synapses 30 may be arranged in a matrix form, wherein N and M are natural numbers equal to or greater than 2, and N and M may or may not be equal to each other.

For this arrangement shown in FIG. 1A, the neuromorphic device may further include a plurality of first lines 12 and a plurality of second lines 22. The plurality of first lines 12 may be coupled to the plurality of pre-synaptic neurons 10, respectively, and may extend in a first direction, for example, a horizontal direction with respect to the orientation of FIG. 1A. The plurality of second lines 22 may be coupled to the plurality of post-synaptic neurons 20, respectively, and may extend in a second direction crossing the first direction, for example, a vertical direction with respect to the orientation of FIG. 1A. Hereinafter, for convenience of explanation, the first lines 12 will be referred to as row lines, and the second lines 22 will be referred to as column lines. The plurality of synapses 30 may be disposed at intersections between the row lines 12 and the column lines 22. Each of the synapses 30 may couple a corresponding one of the row lines 12 to a corresponding one of the column lines 22. In other words, the plurality of synapses 30 may be disposed in regions where the row lines 12 overlap with the column lines 22. That is, each of the synapses 30 may be disposed in an intersection region between the corresponding row line 12 and the corresponding column line 22.

The pre-synaptic neurons 10 may generate a signal (e.g., a signal corresponding to certain data) and transmit the generated signal to the row lines 12. The post-synaptic neurons 20 may receive, through the column lines 22, a synaptic signal corresponding to the signal that was generated by the pre-synaptic neurons 10 and has passed through the synapses 30, and may process the received signal.

The row lines 12 may correspond to axons of the pre-synaptic neurons 10, and the column lines 22 may correspond to dendrites of the post-synaptic neurons 20. However, whether a neuron of interest is a pre-synaptic neuron or a post-synaptic neuron may be determined by its relationship with another neuron. For example, a neuron receiving a synaptic signal from another neuron may function as a post-synaptic neuron. Similarly, a neuron transmitting a signal to another neuron may function as a pre-synaptic neuron. The pre-synaptic neurons 10 and the post-synaptic neurons 20 may be implemented using various circuits such as complementary metal-oxide-semiconductor (CMOS) circuits.

The pre-synaptic neurons 10 and the post-synaptic neurons 20 are electrically coupled by the synapses 30. Herein, the synapse 30 is an element that has an electrical conductance or a weight changing according to an electrical pulse (e.g., a voltage or current) applied to the synapse 30.

Each of the synapses 30 may include a variable resistance element. The variable resistance element is an element capable of switching between different resistance states according to a voltage or current that is applied to both ends thereof. The variable resistance element may have a single-layered structure, or may have a multi-layered structure that includes any of various materials. The single-layered structure may have a plurality of resistance states by itself. The multi-layered structure may have a plurality of resistance states by combinations of two or more layers. The various materials may include any of metal oxides such as transition metal oxides or perovskite-based materials, phase-change materials such as chalcogenide-based materials, ferroelectric materials, ferromagnetic materials, and the like.

An operation in which the variable resistance element of the synapse 30 switches from a high-resistance state to a low-resistance state may be referred to as a set operation, and an operation in which the variable resistance element of the synapse 30 switches from the low-resistance state to the high-resistance state may be referred to as a reset operation.

However, unlike variable resistance elements that are used in memory devices such as RRAM, PRAM, FRAM, and MRAM devices, a resistance value of the synapse 30 in the neuromorphic device does not change abruptly in the set operation and the reset operation. Instead, the synapse 30 exhibits an analog behavior in which electrical conductivity of the synapse 30 gradually changes according to the number and/or magnitude of electrical pulses applied to the synapse 30 during the set operation and the reset operation. Thus, the synapse 30 may have various characteristics distinguishable from those of a variable resistance element of another type of memory device, because the characteristics of the synapse 30 in the neuromorphic device differ from characteristics required for a variable resistance element of another type of memory device.

Another type of memory device preferably uses a variable resistance element that maintain its electrical conductivity before a set operation or a reset operation is performed, even if electrical pulses are repeatedly applied to the variable resistance element. In other words, the variable resistance element may maintain a low resistance value even if electrical pulses are repeatedly applied to the variable resistance element, and the variable resistance element may maintain a high resistance value even if electrical pulses are repeatedly applied thereto. Accordingly, the variable resistance element may store different data by having clearly distinguished low-resistance and high-resistance states.

On the other hand, an electrical conductivity of the synapse 30 suitable for the neuromorphic device, when the synapse 30 is switched to a low-resistance state by a set operation, may gradually increase when electrical pulses having a magnitude equal to or larger than a set voltage and a polarity the same as the set voltage are applied to the synapse 30. Also, the electrical conductivity of the synapse 30, when the synapse 30 is switched to a high-resistance state by a reset operation, may gradually decrease when electrical pulses having a magnitude equal to or larger than a reset voltage and a polarity the same as the reset voltage are applied to the synapse 30. In this case, an electrical conductivity of the synapse 30 may not be changed when electrical pulses having a magnitude smaller than the set voltage and/or the reset voltage are applied to the synapse 30.

A learning operation of the neuromorphic device shown in FIG. 1A will be described below with reference to FIGS. 1B and 1C. For convenience of explanation, the row lines 12 may include a first row line 12A, a second row line 12B, a third row line 12C, and a fourth row line 12D, from a top to a bottom of the neuromorphic device illustrated in FIGS. 1A to 1C. The column lines 22 may include a first column line 22A, a second column line 22B, a third column line 22C, and a fourth column line 22D, from a left side to a right side of the neuromorphic device illustrated in FIGS. 1A to 1C.

Referring to FIG. 1B, in an initial state, all of the synapses 30 in the neuromorphic device may have a relatively low electrical conductivity, that is, the synapses 30 may be in a high-resistance state. If any of the synapses 30 are in a low-resistance state, an initialization operation for changing the resistance state of these synapses 30 from the low-resistance state to the high-resistance state may be further required.

Each of the synapses 30 may have a certain critical value used to change its resistance and/or electrical conductivity. More specifically, if a voltage or current lower than the certain critical value is applied to each of the synapses 30, the electrical conductivity of the synapses 30 may not change, but if a voltage or current equal to or higher than the certain critical value is applied to each of the synapses 30, the electrical conductivity of the synapses 30 may change.

In an initial stage, in order to perform an operation for learning certain data in any column line 22, an input signal corresponding to the certain data may be input to the row lines 12 so that an electrical pulse is selectively applied to each of the row lines 12 according to the certain data. The input signal may be input by applying electrical pulses to row lines 12 corresponding to '1' in the certain data, and not to row lines 12 corresponding to '0' in the certain data. For example, if an input signal corresponding to certain data '0011' is input to the row lines 12 of FIG. 1B, an electrical pulse may not be applied to the first and second row lines 12A and 12B, and may be applied only to the third and fourth row lines 12C and 12D.

While the input signal is being input, the column lines 22 may be selectively driven at a suitable voltage or current for the learning operation.

As an example, if a column line 22 to learn specific data is predetermined, the predetermined column line 22 may be driven such that synapses 30 located at intersections between the row lines 12 corresponding to '1' and the predetermined column 22 may receive a voltage equal to or higher than a set voltage. The set voltage may be a voltage required for the set operation. Simultaneously, the remaining column lines 22, which are column lines 22 other than the predetermined column line 22, may be driven such that the remaining synapses 30 may receive a voltage lower than the set voltage. Referring to FIGS. 1A to 1C, the remaining synapses 30 are the synapses 30 other than the synapses 30 that are located at the intersections between the row lines 12 corresponding to '1' and the predetermined column lines 22.

For example, if the magnitude of the set voltage is Vset and the third column line 22C is predetermined as a column line to learn the certain data '0011,' the magnitude of the electrical pulse that is applied to each of the third and fourth row lines 12C and 12D may be equal to or higher than Vset, and a voltage that is applied to the third column line 22C may be 0 V, such that first and second synapses 30A and 30B located at intersections between the third column line 22C and the third and fourth row lines 12C and 12D receive a voltage equal to or higher than Vset. Thus, the first and second synapses 30A and 30B may switch from the high-resistance state to a low-resistance state. That is, each of the first and second synapses 30A and 30B may undergo the set operation.

The electrical conductivity of the first and second synapses 30A and 30B in the low-resistance state may gradually increase as the number of electrical pulses applied to the first and second synapses 30A and 30B increases. That is, each of the first and second synapses 30A and 30B may undergo a potentiation operation.

On the other hand, a voltage applied to the remaining column lines 22, that is, to the first, second, and fourth column lines 22A, 22B, and 22D, may have a magnitude between 0V and Vset, such that the remaining synapses 30, which are the synapses 30 other than the first and second synapses 30A and 30B, receive a lower voltage than Vset. For example, the voltage applied to the remaining column lines 22 may be equal to ½ Vset. Thus, resistance states of the remaining synapses 30, which are the synapses 30 other than the first and second synapses 30A and 30B, may not change. In this case, a flow of current or electrons is indicated by dashed arrows.

If the row lines 12 and the column lines 22 are driven in the above-described manner, the electrical conductivity of the synapses 30 that receive electrical pulses may gradually increase, and thus a current flowing through the synapses 30 that receive the electrical pulses may increase. For example, the electrical conductivity of the synapses 30A and 30B may increase when the synapses 30A and 30B receive the electrical pulses from the third and fourth row lines 12C and 12D, respectively, and a current flowing to the third column line 22C through the synapses 30A and 30B may increase. When the current flowing to the third column line 22C is measured and the measured current reaches a certain critical current, the third column line 22C may be a 'column line that has leaned specific data,' for example, a column line that has learned the certain data '0011.'

As another example, a column line 22 to learn specific data may not be predetermined. In this case, a current flowing to each of the column lines 22 is measured while electrical pulses corresponding to the specific data are applied to the row lines 12. Based on the current measurements, a column line, e.g., the first column line 22A, that first reaches the certain critical current before the other column lines, e.g., the second to fourth column lines 22B to 22D, may be determined to be a column line that has learned the specific data.

In the above-described manner, the other column lines may learn different data in other learning operations.

In any case, when the learning operation is terminated, the previously trained column line 22 may be floated, so that another column line 22 may learn different data. That is, the third column line 22C may be floated after it is trained.

FIG. 1C shows a case in which another one of the column lines 22 learns different data when the third column line 22C is floated. For example, FIG. 1C shows a case in which the fourth column line 22D learns the different data '0110.'

Referring to FIG. 1C, the fourth column line 22D may learn the different data '0110' while the row lines 12 and the column lines 22 are driven in a manner similar to the manner described above with reference to FIG. 1B.

For example, the magnitude of an electrical pulse that is applied to the second and third row lines 12B and 12C may be equal to or higher than Vset, and a voltage that is applied to the fourth column line 22D may be 0 V, such that third and fourth synapses 30C and 30D located at intersections between the fourth column line 22D and the second and third row lines 12B and 12C receive a voltage that is equal to or higher than Vset. Thus, each of the third and fourth synapses 30C and 30D may change from the high-resistance state to a low-resistance state. That is, each of the third and fourth synapses 30C and 30D may undergo a set operation.

The electrical conductivity of the third and fourth synapses 30C and 30D in the low-resistance state may gradually increase as the number of electrical pulses applied to the second and third row lines 12B and 12C increases. That is, each of the third and fourth synapses 30C and 30D may undergo a potentiation operation.

While the fourth column line 22D is learning the different data '0110,' electrical pulses may not be applied to the first and fourth row lines 12A and 12D. A voltage that is applied to the first and second column lines 22A and 22B may be between 0V and Vset, for example, ½ Vset, such that the remaining synapses 30, which are the synapses 30 other than the third and fourth synapses 30C and 30D, receive a lower voltage than Vset. As described above, the third column line 22C may be in the floating state as the third and fourth synapses 30C and 30D are being trained. A flow of current or electrons while the third and fourth synapses 30C and 30D are being trained is indicated by dashed arrows.

However, since the third column line 22C, which has been previously trained, is in a floating state, it may have a voltage that is greater than 0V and lower than Vset. As a result, due to the voltage of the third column line 22C, a flow of leakage current or electrons, as indicated by solid line arrows, may occur during the learning operation of the fourth column line 22D. Particularly, since the first and second synapses 30A and 30B are changed to the low-resistance state during the learning operation of the third column line 22C, a flow of leakage current or electrons may occur through the first and second synapses 30A and 30B.

Since the leakage current adds to and increases a current flowing through the fourth column line 22D, a current flowing through the fourth column line 22D may reach a predetermined threshold current before the fourth column line 22D is trained. In other words, a current flowing through the fourth column line 22D may be over-estimated, and thus a learning error, in which the untrained fourth column line 22D is erroneously identified as being trained, may occur. The likelihood of the learning error may increase as the number of the column lines 22 that have been trained and floated increases, and as a number of the row lines 12 and a number of the column lines 22 in the neuromorphic device increase.

In order to prevent the learning error, a transistor for controlling an access to a variable resistance element may be included together with the variable resistance element, in each synapse of the neuromorphic device. In other words, each synapse may include a variable resistance element and a transistor coupled to the variable resistance element. However, since a transistor is typically fabricated using a semiconductor substrate and occupies a large area, including the transistor in each synapse may interrupt a higher degree of integration of a neuromorphic device. At this time, access elements other than a transistor have not been developed. Accordingly, a way in which a transistor can be included in a synapse without occupying a relatively large area is desired.

In the present disclosure, a new neuromorphic device, which has a higher degree of integration and a lower likelihood of a learning error caused by a leakage current than the neuromorphic device of the comparative example, and an operating method of the new neuromorphic device, will be provided.

Figure 2A:
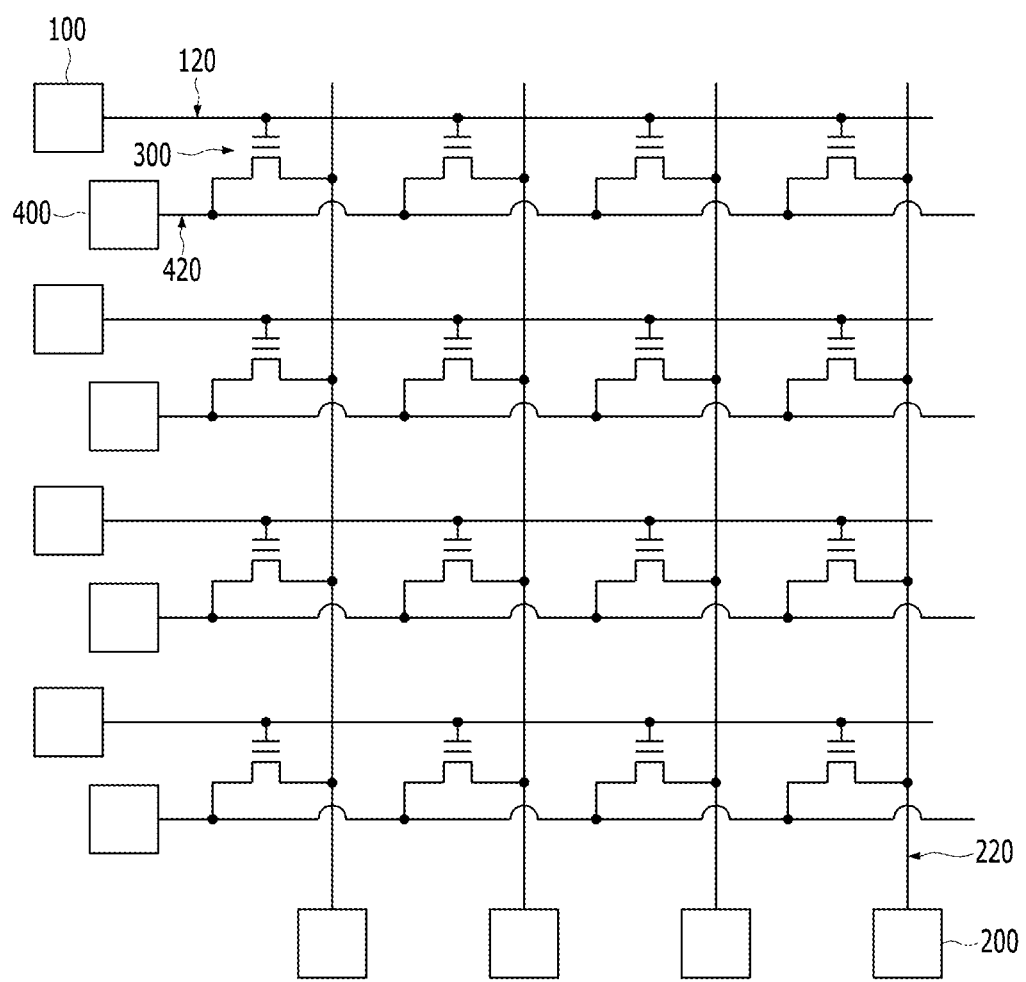
FIG. 2A is a view illustrating a neuromorphic device according to an embodiment.
Figure 2B:
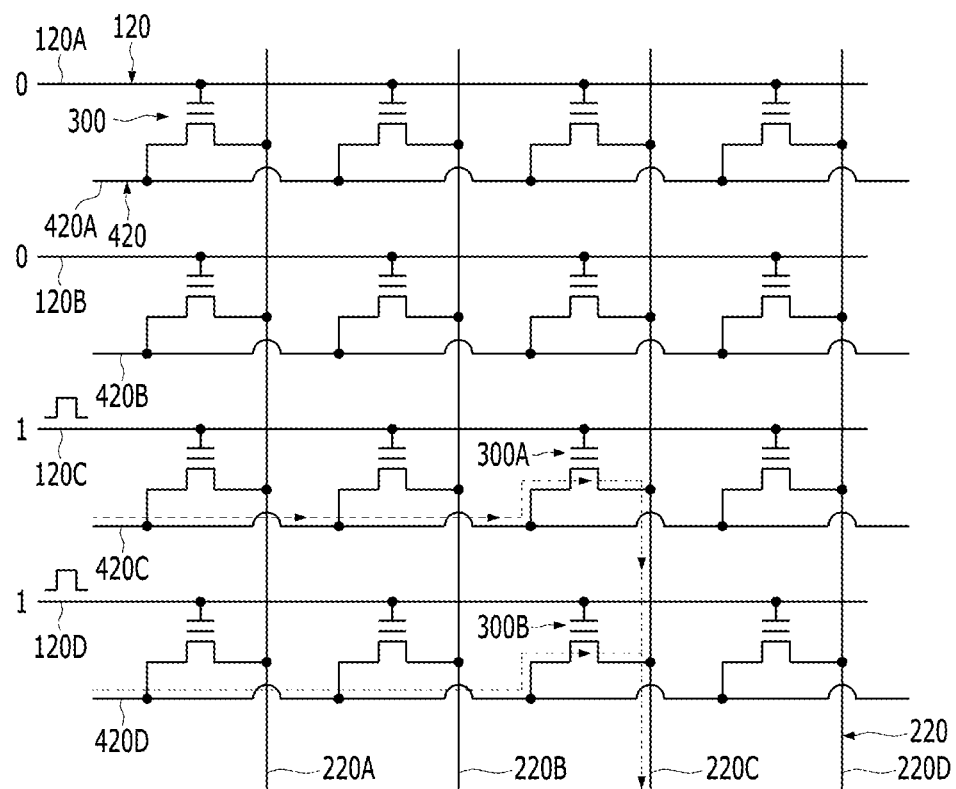
FIGS. 2B and 2C are views illustrating an example of an operating method of the neuromorphic device of FIG. 2A.
Figure 2C:
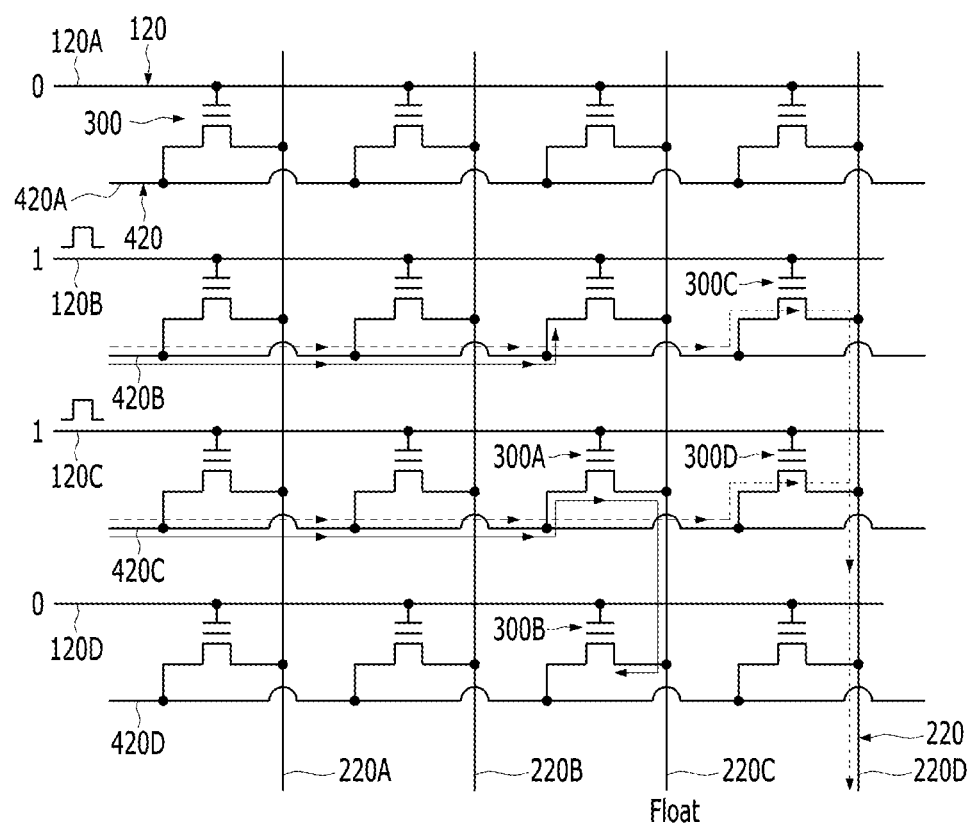

FIG. 2A is a view illustrating a neuromorphic device according to an embodiment. FIGS. 2B and 2C are views illustrating an example of an operating method of the neuromorphic device of FIG. 2A.

Referring to FIG. 2A, the neuromorphic device may include a plurality of row lines 120, a plurality of additional row lines 420, a plurality of column lines 220, and synapses disposed at intersections between the row lines 120, the additional row lines 420, and the column lines 220. The plurality of row lines 120 and the plurality of additional row lines 420 may extend in a first direction, for example, a horizontal direction with respect to the orientation of FIG. 2A. The plurality of column lines 220 may extend in a second direction crossing the first direction, for example, a vertical direction with respect to the orientation of FIG. 2A. The synapses may be disposed in intersection regions between the row lines 120, the additional row lines 420, and the column lines 220.

Each of the synapses may include a transistor 300, which has a floating gate (or a charge trap layer) and a control gate insulated from the floating gate. That is, each of the synapses may have a 1-transistor structure. The control gate of the transistor 300 may be coupled to a corresponding one of the row lines 120, and the other two junctions of the transistor 300 may be respectively coupled to a corresponding one of the additional row lines 420 and a corresponding one of the column lines 220. For example, a drain of the transistor 300 may be coupled to the corresponding additional row line 420 and a source of the transistor 300 may be coupled to the corresponding column line 220, or vice versa.

Circuits for driving the row lines 120, the additional row lines 420, and the column lines 220, may be respectively coupled to terminals of the row lines 120, the additional row lines 420, and the column lines 220. For example, each of the row lines 120 may be coupled between a pre-synaptic neuron 100 and a control gate of a corresponding transistor 300, and may transmit a signal corresponding to certain data from the pre-synaptic neuron 100 to the control gate of the corresponding transistor 300. Each of the additional row lines 420 may be coupled between a drain voltage applying circuit 400 and one junction, for example, a drain, of a corresponding transistor 300, and may provide a certain voltage to the drain of the corresponding transistor 300. Each of the column lines 220 may be coupled between a post-synaptic neuron 200 and the other junction, for example, a source, of a corresponding transistor 300, and may receive and process a signal passing through the corresponding transistor 300.

When each of the synapses includes one of the transistors 300 having the floating gate, and the gates and first junctions of the transistors 300 are connected with each other along the first direction while the second junctions of the transistors 300 are connected with each other along the second direction, the error in the learning and recognition process may be reduced or prevented. The reduction and/or prevention of the error in the learning and recognition process will be described below with reference to FIGS. 2B and 2C in more detail.

For convenience of explanation, the row lines 120 may include a first row line 120A, a second row line 120B, a third row line 120C, and a fourth row line 120D, as illustrated from a top to a bottom of each of FIGS. 2B and 2C. The column lines 220 may include a first column line 220A, a second column line 220B, a third column line 220C and a fourth column line 220D, as illustrated from a left side to a right side of each of FIGS. 2B and 2C. The additional row lines 420 may include a first additional row line 420A, a second additional row line 420B, a third additional row line 420C, and a fourth additional row line 420D, as illustrated from the top to the bottom of each of FIGS. 2B and 2C.

Referring to FIG. 2B, in an initial state, the transistors 300 may have a relatively high threshold voltage.

In this state, in order to perform an operation for learning certain data in any of the column line 220A, 220B, 220C, and 220D, an input signal corresponding to the certain data may enter the row lines 120 in response to outputs of the pre-synaptic neurons 100. The input signal may enter the row lines 120 by applying voltage pulses to the row lines 120. Any of the row lines 120 corresponding to '0' data may receive no voltage pulses, e.g., a voltage of 0. Any of the row lines 120 corresponding to '1' data may receive voltage pulses having a certain magnitude and width. For example, if an input signal corresponding to '0011' data enters the row lines 120, no voltage pulses, or a voltage of 0V, may be applied to the first and second row lines 120A and 120B, and voltage pulses having the certain magnitude and width may be applied to the third and fourth row lines 120C and 120D.

During the learning operation, the column lines 220 and the additional row lines 420 may be driven at a suitable voltage or current for learning.

For example, if a column line 220 to learn the certain data is predetermined, the predetermined column line may be driven such that each of the transistors 300 located at intersections between the predetermined column line 220 and the row lines 120 corresponding to '1' are changed to a state having a relatively low threshold voltage, and the remaining column lines 220 that are not the predetermined column line may be driven such that the remaining transistors 300 may maintain the relatively high threshold voltage. For example, if the third column line 220C is predetermined to learn '0011' data, the third column line 220C and the third and fourth row lines 120C and 120D may be driven such that the threshold voltage of each of the first and second transistors 300A and 300B, which are located at intersections between the third column line 220C and the third and fourth row lines 120C and 120D, respectively, decreases. Specifically, when a voltage, which has the minimum magnitude required for a change in the threshold voltage of the first and second transistors 300A and 300B, is Vset, the magnitude of an electrical pulse that is applied to each the third and fourth row lines 120C and 120D may be equal to or higher than Vset, and a voltage that is applied to the third column line 220C may be 0 V. In this case, since the threshold voltage of the first and second transistors 300A and 300B is reduced, a flow of current or electrons from the third and fourth additional row lines 420C and 420D to the third column line 220C may occur through the first and second transistors 300A and 300B, as indicated by the dashed arrows in FIG. 2B. As the number of the voltage pulses applied to the third and fourth row lines 120C and 120D increases, the threshold voltage of the first and second transistors 300A and 300B may gradually decrease. That is, the electrical conductivity of the synapses corresponding to the first and second transistors 300A and 300B may gradually increase. Therefore, a flow of current or electrons passing through the first and second transistors 300A and 300B may gradually increase when the number of applied voltage pulses increases. The magnitude and width of the applied voltage pulses may be substantially constant.

A voltage that is applied to the remaining column lines 220, that is, to the first, second, and fourth column lines 220A, 220B and 220D, may be between 0V and Vset, such that the remaining transistors 300, which are the transistors 300 other than the first and second transistors 300A and 300B, each receive a voltage lower than Vset through the first, second, and fourth column lines 220A, 220B and 220D. For example, a voltage equal to ½ Vset may be applied to each of the first, second, and fourth column lines 220A, 220B, and 220D. Thus, the threshold voltage of the remaining transistors 300, which are the transistors 300 other than the first and second transistors 300A and 300B, may not change. That is, the remaining transistors 300 may maintain the relatively high threshold voltage.

A mechanism for gradually reducing the threshold voltage of the transistor 300 and gradually reducing a specific voltage applied to the transistor 300 will be described later with reference to FIG. 3 in more detail.

When the threshold voltage of any transistor 300 decreases, a voltage having a certain magnitude and polarity may be applied to one of the additional row lines 420 in order to generate a flow of current or electrons through the transistor 300 to the column line 220 being trained. For example, the voltage applied to one of the additional row lines 420 may have the same magnitude and polarity as voltage pulses applied to a corresponding one of the row lines 120. That is, no voltage pulses, or a voltage of 0V, may be applied to the first and second additional row lines 420A and 420B that respectively correspond to the first and second row lines 120A and 120B, and a voltage equal to or higher than Vset may be applied to the third and fourth row lines 420C and 420D. In this case, one voltage generating circuit may commonly drive the additional row lines 420 and the row lines 120, and thus a degree of integration of the neuromorphic device may increase and a cost of the neuromorphic device may decrease. However, in another embodiment, at least one of the magnitude and the polarity of the voltage applied to the additional row lines 420 may be different from the voltage pulses applied to the row lines 120.

As another example, a column line 220 may not be predetermined to learn certain data. In this case, a current flowing through each of the column lines 220 is measured while voltage pulses corresponding to the certain data are applied to the row lines 120. A certain voltage, for example, a voltage having the same magnitude and polarity as the voltage pulses applied to the row lines 120, is applied to the additional row lines 420. Based on the measurements, a column line 220 that first reaches a certain critical current, for example, the third column line 220C, may be a column line 220 that learned the certain data.

In the above-described manner, different column lines 220 may learn different data.

When the learning process is terminated, the previously trained column line 220, for example, the third column line 220C, may be floated so that another column line 220 can learn different data.

FIG. 2C shows a case in which another column line 220 learns the different data when the third column line 220C is floated. For example, FIG. 2C shows a case in which the fourth column line 220D learns '0110' data.

Referring to FIG. 2C, the row lines 120, the column lines 220, and the additional row lines 420 may be driven in a manner similar to the manner described above, so that the fourth column line 220D can learn the '0110' data.

Particularly, as an example, the magnitude of an electrical pulse that is applied to each of the second and third row lines 120B and 120C may be equal to or higher than Vset, and a voltage that is applied to the fourth column line 220D may be 0 V. Accordingly, third and fourth transistors 300C and 300D, located at intersections between the fourth column line 220D being trained and the second and third row lines 120B and 120C corresponding to '1,' receive a voltage equal to or higher than Vset. Thus, the threshold voltage of the third and fourth transistors 300C and 300D is reduced. On the other hand, no voltage pulses, or a voltage of 0V, may be applied to the first and fourth row lines 120A and 120D corresponding to '0'. A voltage that is applied to each of the remaining column lines 220, which are column lines 220 other than the previously-trained third column line 220C and the fourth column line 220D to be trained, may be between 0V and Vset. That is, a voltage applied to the first and second column lines 220A and 220B may be between 0V and Vset, for example, ½ Vset, such that the remaining transistors 300, which are the transistors 300 other than the third and fourth transistors 300C and 300D, receive a voltage lower than Vset. No voltage pulses, or a voltage of 0V, may be applied to the first and fourth additional row lines 420A and 420D, and a voltage having a magnitude equal to or larger than Vset may be applied to the second and third additional row lines 420B and 420C. In this case, since the threshold voltage of the third and fourth transistors 300C and 300D is reduced, a flow of current or electrons from the second and third additional row lines 420B and 420C to the fourth column line 220D may occur through the third and fourth transistors 300C and 300D, as indicated by the dashed arrows of FIG. 2C.

As the number of the voltage pulses applied to the second and third row lines 120B and 120C increases, the threshold voltage of the third and fourth transistors 300C and 300D may gradually decrease. Therefore, a flow of current or electrons passing through the third and fourth transistors 300C and 300D may gradually increase. The magnitude and width of the applied voltage pulses may be substantially constant.

Since the previously-trained third column line 220C is in a floating state, the third column line 220C may have a voltage that is greater than 0V and less than Vset. Due to the voltage of the third column line 220C, a flow of leakage current or electrons may occur, as indicated by solid line arrows in FIG. 2C. Referring to the solid line arrows, at least a portion of the flow of leakage current or electrons may be blocked before reaching the fourth column line 220D, because the transistors 300 without a threshold voltage that has been lowered during the previous learning process can naturally block the flow of leakage current or electrons. Furthermore, even if the first and second transistors 300A and 300B each have a threshold voltage that has been lowered by the previous learning process, the flow of current or electrons indicated by the solid arrows may be allowed when the first and second transistors 300A and 300B are turned on by applying a certain voltage to the control gate of each of the first and second transistors 300A and 300B, in consideration of the characteristics of the transistor 300. However, in the embodiment shown in FIG. 2C, since no voltage pulses are applied to the fourth row line 120D, which is coupled to the control gate of the second transistor 300B, the second transistor 300B may be in a turn-off state, and thus the flow of leakage current or electrons may be blocked from passing through the second transistor 300B.

In summary, since the voltage of the previously-trained column line 220 is relatively low, a flow of leakage current or electrons through the previously learned column line 220 may be generated. However, in the present embodiment, since the transistors 300, which are coupled to the row lines 120 that are not being applied with voltage pulses corresponding to the certain data, may be in a turn-off state even if the transistors 300 are coupled to the previously-trained column line 220, a flow of leakage current or electrons through the transistors 300 can be blocked. Therefore, a flow of leakage current or electrons that reaches the column line 220 to be trained may be reduced or blocked. As a result, over-estimating the current flowing through the column line 220 to be trained may be prevented, and thus a learning and/or a recognition error may be reduced or prevented.

In another example, a column line 220 may not be predetermined to learn certain data. In this case, a current flowing to each of the column lines 220 other than the third column line 220C that has been trained, is measured while voltage pulses corresponding to the certain data are applied to the row lines 120. A certain voltage, for example, a voltage, having the same magnitude and polarity as the voltage pulses corresponding to the certain data, is applied to the additional row lines 420. Based on the measured current, a column line 220 that first reaches a certain critical current, for example, the fourth column line 220D, may be determined to be a column line 220 that has learned the certain data. In this case, the transistors 300 coupled to the row lines 120 to which voltage pulses corresponding to the certain data are not applied may be in a turn-off state, thereby blocking a flow of leakage current or electrons.

By using the aforementioned neuromorphic device in a column-by-column learning process, transistors coupled to a certain row line are turned off, and thus the transistors can block a leakage current due to the potential of the previously trained column line in a row direction. Accordingly, the learning and recognition accuracy of the neuromorphic device may be improved.

A mechanism, in which the threshold voltage of the transistor 300 gradually decreases, will be described with reference to FIG. 3.

Figure 3:
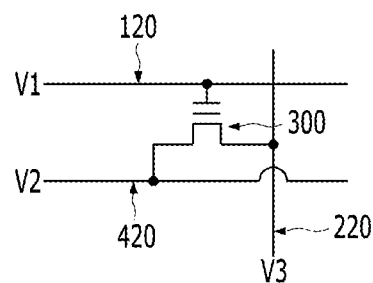
FIG. 3 is a view illustrating a threshold voltage reduction mechanism of a transistor in the neuromorphic device of FIG. 2A.

FIG. 3 is a view illustrating a threshold voltage reduction mechanism of a transistor in the neuromorphic device of FIG. 2A.

Referring to FIG. 3, a transistor 300 may include a floating gate and a control gate insulated from the floating gate. The control gate of the transistor 300 may be coupled to a row line 120. Two junctions of the transistor 300, that is, a drain and a source of the transistor 300, may be coupled to an additional row line 420 and a column line 220, respectively. Voltages applied to the row line 120, the additional row line 420, and the column line 220 may be referred to as a first voltage V1, a second voltage V2, and a third voltage V3, respectively. Specifically, the first voltage V1 may be applied to the row line 120 in the form of voltage pulses.

As an example, if holes are trapped in the floating gate of the transistor 300 and electrons are emitted from the floating gate, the threshold voltage of the transistor 300 may decrease. On the other hand, if holes are emitted from the floating gate of the transistor 300 and electrons are trapped in the floating gate, the threshold voltage of the transistor 300 may increase.

In this case, in order to trap the holes into the floating gate of the transistor 300, the first voltage V1 may be a relatively negative voltage having a magnitude equal to or larger than a certain threshold value, compared to the third voltage V3. On the other hand, in order to emit the holes from the floating gate of the transistor 300, the first voltage V1 may be a relatively positive voltage having a magnitude equal to or larger than a certain threshold value, compared to the third voltage V3.

For example, a magnitude of a voltage difference between the control gate and the source of the transistor 300 of $|V^+ - V^-|$ may be required for trapping/emitting the holes. When the holes are being trapped in the floating gate of the transistor 300, the first voltage V1 may be a negative voltage corresponding to $V^-$ and the third voltage V3 may be a positive voltage corresponding to $V^+$. When the holes are being emitted from the floating gate of the transistor 300, the first voltage V1 may be a positive voltage corresponding to $V^+$ and the third voltage V3 may be a negative voltage corresponding to $V^-$. On the other hand, if a voltage difference between the control gate and the source of the transistor 300 is smaller than $|V^+ - V^-|$, the holes may not be trapped or emitted. For example, if the first voltage V1 is a positive voltage corresponding to $V^+$ or a negative voltage corresponding to $V^-$ and the third voltage V3 is 0V, the trapping/emission of the holes may not occur. Similarly, if the third voltage V3 is a positive voltage corresponding to $V^+$ or a negative voltage corresponding to $V^-$ and the first voltage V1 is 0V, the trapping/emission of the holes may not occur.

The second voltage V2 may have the same polarity as the first voltage V1. In an embodiment, the second voltage V2 may have the same polarity and the same magnitude as the first voltage V1.

In the learning operation of the transistor 300 in FIG. 3, in order to reduce the threshold voltage of the transistor 300, a negative voltage of $V^-$ may be applied to the row line 120, the negative voltage of $V^-$ may be applied to the additional row line 420, and a positive voltage of $V^+$ may be applied to the column line 220. Here, since the first voltage V1 is applied in the form of pulses, the amount of the holes trapped in the floating gate of the transistor 300 may increase as the number of voltage pulses applied to the row line 120 increases. In other words, the threshold voltage of the transistor 300 may gradually decrease as the number of the voltage pulses applied to the row line 120 increases. Therefore, a flow of current or electrons passing through the transistor 300 may increase as the number of voltage pulses applied to the row line 120 increases.

As a result, the transistor 300, which includes the floating gate and the control gate that is supplied with the voltage pulses, may show an analog behavior. That is, the threshold voltage and/or electrical conductivity of the transistor 300 gradually changes according to the number of the voltage pulses applied to the transistor 300. Accordingly, it may be appropriate to use the transistor 300 as a synapse.

FIGS. 4A to 4D are views illustrating an example of a learning process of a neuromorphic device according to an embodiment. For convenience of explanation, a portion of the neuromorphic device of FIG. 2A including two row lines, two additional row lines, three column lines, and six transistors located at intersections of the lines may be shown by FIGS. 4A to 4D. Also, as described in FIG. 3, a transistor of this embodiment may have a threshold voltage that decreases by trapping holes. A voltage difference between the control gate and the source of the transistor 300 that may be used to reduce the threshold voltage may be $|V^+ - V^-|$.

Figure 4A:
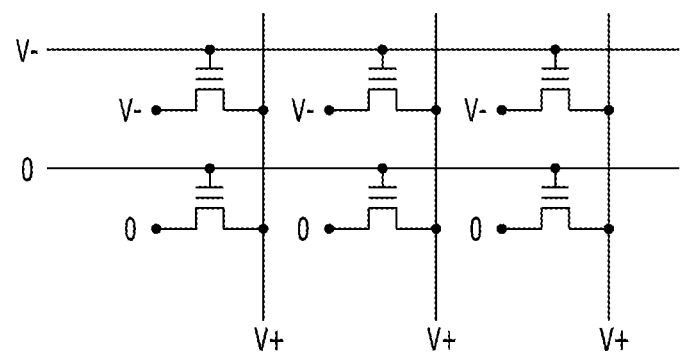
FIGS. 4A to 4D are views illustrating an example of a learning process of a neuromorphic device according to an embodiment.

First, referring to FIG. 4A, in order for the column lines to learn certain data, for example, '10' data, voltage pulses corresponding to $V^-$ may be applied to a first row line. No voltage pulses, or a voltage of 0V, may be applied to a second row line. A voltage having the same polarity and magnitude as the voltage pluses applied to the row lines may be applied to the additional row lines. That is, a voltage of $V^-$ may be applied to a first additional row line, and no voltage pulses, or a voltage of 0V, may be applied to a second additional row line. Here, to secure a voltage difference of $|V^+ - V^-|$, a voltage of $V^+$ may be applied to the column lines.

Specifically, in FIG. 4A, a case in which a voltage of $V^+$ is applied to all of the column lines is shown. FIG. 4A may illustrate a case in which a column line to learn the certain data is not predetermined. In this case, the threshold voltage of the three transistors coupled to the first row line may start to decrease as holes are trapped by the three transistors, and thus a flow of electrons from the first additional row line to the three column lines may start to occur. That is, a current may flow through the three column lines. As the number of the voltage pulses applied to the first row line increases, the current flow through the three column lines may increase. The current through each of the three column lines may be measured. When a current measured through any column line first reaches a certain critical current, the column line may be determined to be a column line that has learned the certain data. For example, the first column line among the three column lines may be the column line that has learned the certain data, for example, '10' data.

Figure 4B:
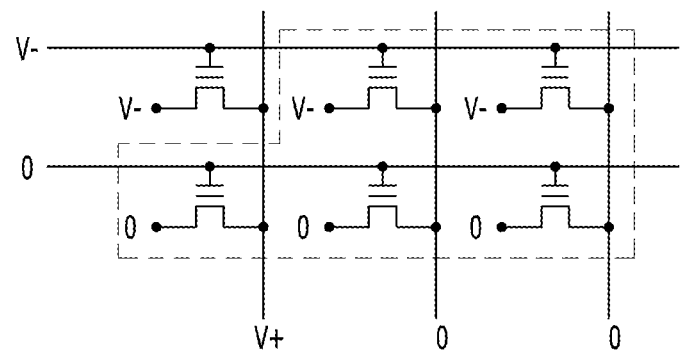

Meanwhile, when a column line to be trained, e.g., the first column line, is predetermined, a voltage of $V^+$ may be applied to the column line that is predetermined to be trained, and a voltage of 0V may be applied to the remaining column lines, as shown in FIG. 4B, which will be described later. That is, when the column line to be trained is predetermined, the step of FIG. 4A may be skipped and the step of FIG. 4B may be performed directly.

Referring to FIG. 4B, when voltages are applied to the row lines, the additional row lines and the first column line are maintained at voltages that are equal to the voltages applied in the step of FIG. 4A, and a voltage of 0V may be applied to the remaining column lines, in order to reinforce the learning of the '10' data by the first column line. In this case, the threshold voltage of the transistor excluded from the group of transistors surrounded by a dashed line shown in FIG. 4B, that is, the threshold voltage of the transistor located at the intersection of the first row line, the first additional row line, and the first column line, may be further reduced. Thus, the current flow through the first column line may be further increased.

Figure 4C:
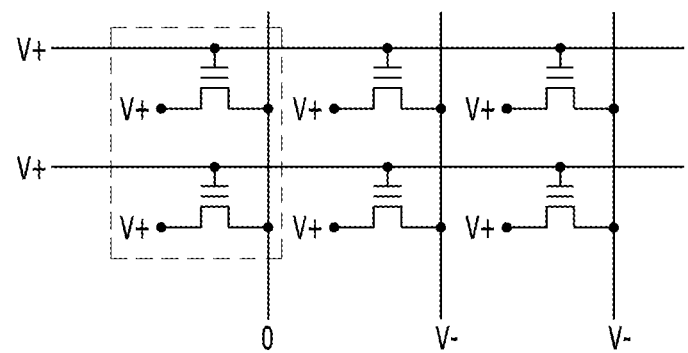

Then, referring to FIG. 4C, an initialization operation may be performed on the remaining transistors. That is, an operation that increases the threshold voltage of the transistors other than the transistors coupled to the previously trained column line, e.g., the transistors coupled to the first column line indicated by a dashed line in FIG. 4C, may be performed. The initialization operation may be performed in order to prevent an undesired reduction in the threshold voltage of the remaining transistors when voltage pulses are applied to the remaining transistors, which are coupled to the second and third column lines that are not to be trained by the learning process of FIG. 4A and/or FIG. 4B.

During the initialization operation, a voltage for emitting the holes from the transistors coupled to the second and third column lines may be applied to the row lines and the column lines. For example, a voltage of $V^-$ may be applied to the second and third column lines, and a voltage of $V^+$ may be applied to the first and second row lines. In this case, the holes may be emitted from the floating gates to the sources of the transistors that are coupled to the second and third column lines, and thus the threshold voltage of these transistors may be increased again. At the same time, a voltage of 0V may be applied to the first column line, and thus a change in the threshold voltage of the transistors coupled to the first column line may be prevented when the other transistors are initialized. During the initialization operation, a voltage applied to the additional row lines may be the same as the voltage applied to the row lines.

Figure 4D:
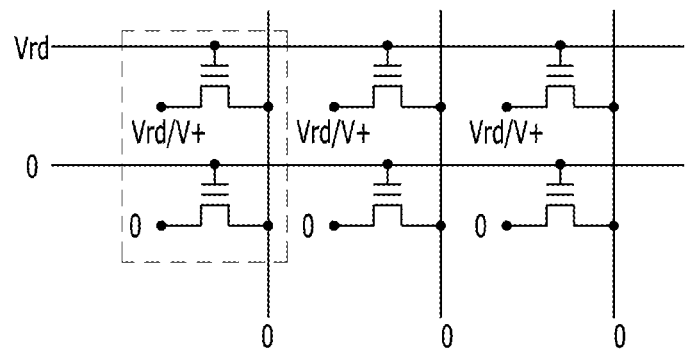

Then, referring to FIG. 4D, after the above learning and initialization operations are performed, an operation of verifying and/or recognizing that the '10' data is learned in the first column line may be performed.

During the verification or recognition process, a read voltage of Vrd may be applied to the first row line, which corresponds to the '1' in the '10' data; and no voltage, or a voltage of 0V, may be applied to the second row line, which corresponds to the '0' in the '10' data. The read voltage of Vrd may be a certain positive voltage that has a magnitude equal to or smaller than $V^+$. A voltage applied to each of the additional row lines may have the same polarity and magnitude as the voltage applied to the corresponding row line. Alternatively, the voltage applied to each of the additional row lines may have the same polarity as, and a larger magnitude than, the voltage applied to the corresponding row line. For example, when the read voltage of Vrd, which is smaller than $V^+$, is applied to the first row line, a voltage of Vrd or $V^+$ may be applied to the first additional row line, and no voltage, or a voltage of 0V, may be applied to the second additional row line. A voltage of 0V may be applied to the column lines. In this case, by measuring a current flowing through all the column lines and confirming that a current flowing through the first column is the greatest current flowing through any of the column lines, it is possible to verify and/or recognize that the '10' data is learned by the first column line. As described above, since the threshold voltage of the transistors coupled to the first column line, specifically, the threshold voltage of the transistor located at the intersection of the first row line and the first column line, is lowered and the threshold voltage of the transistors coupled to the second and third column lines is not lowered, the current flowing through the first column line may be confirmed as being the greatest current flowing through any of the column lines.

The processes of FIG. 4A to FIG. 4D may be repeatedly performed until all of the column lines learn different data.

Figure 5:
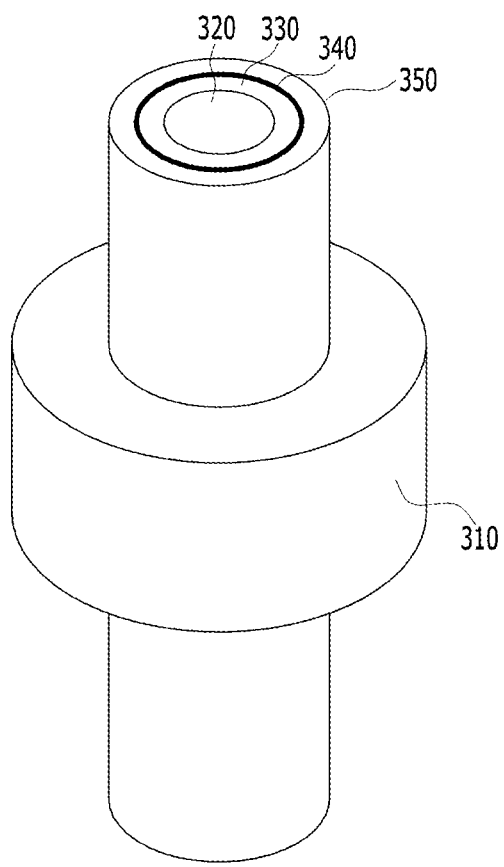
FIG. 5 is a perspective view illustrating a synapse of a neuromorphic device according to an embodiment.

FIG. 5 is a perspective view illustrating a synapse of a neuromorphic device according to an embodiment. As described above, the synapse may include a transistor having a floating gate and a control gate.

Referring to FIG. 5, the synapse, that is, the transistor, may include a semiconductor pillar 320 extending in a vertical direction from a top surface of a substrate (not shown). The synapse may further include a tunnel insulating layer 330, a floating gate 340, a charge blocking layer 350, and a control gate 310, which are sequentially stacked around the semiconductor pillar 320.

The semiconductor pillar 320 may provide a channel region and junction regions of the transistor, and may include any of various semiconductor materials, such as a polysilicon. Also, in order to provide the channel region and the junction regions, the semiconductor pillar 320 may include various impurity regions respectively including impurities of various conductivity types, which are formed by impurity doping. The channel region of the semiconductor pillar 320 may be located at a portion of the semiconductor pillar 320 that overlaps the control gate 310. The junction regions of the semiconductor pillar 320 may be located at both sides of the channel region, that is, at a top portion and at a bottom portion of the semiconductor pillar 320, respectively, with respect to the orientation of FIG. 5.

The tunnel insulating layer 330 may allow tunneling of charges, e.g., holes or electrons, between the semiconductor pillar 320 and the floating gate 330 according to a voltage applied to the control gate 310. The tunnel insulating layer 330 may include any of various insulating materials, such as a silicon oxide, a silicon nitride, or a combination of a silicon oxide and a silicon nitride.

The floating gate 340 may trap and/or store charges transferred from the semiconductor pillar 320, or may emit the charges trapped and/or stored in the floating gate 340 to the semiconductor pillar 320, according to a voltage applied to the control gate 310. The floating gate 340 may include a material that can trap and/or store the charges, for example, an insulating material such as a silicon nitride or a semiconductor material such as polysilicon.

The charge blocking layer 350 may block the movement of charges between the floating gate 340 and the control gate 310, and may include any of various insulating materials, such as a silicon oxide, a silicon nitride, or a combination of a silicon oxide and a silicon nitride.

When the floating gate 340 includes an insulating material, the insulating material included in the floating gate 340 may be different from insulating materials included in the tunnel insulating layer 330 and the charge blocking layer 350. For example, when the floating gate 340 includes a silicon nitride, the tunnel insulating layer 330 and the charge blocking layer 350 may each include a silicon oxide. That is, the tunnel insulating layer 330, the floating gate 340, and the charge blocking layer 350 may have an ONO (Oxide-Nitride-Oxide) structure. In the embodiment shown in FIG. 5, the tunnel insulating layer 330, the floating gate 340, and the charge blocking layer 350 encircle a whole side surface of the semiconductor pillar 320. However, locations and shapes of the tunnel insulating layer 330, the floating gate 340, and the charge blocking layer 350 may be variously changed as long as the tunnel insulating layer 330, the floating gate 340, and the charge blocking layer 350 are interposed between the semiconductor pillar 320 and the control gate 310.

The control gate 310 may serve as a gate of the transistor. The control gate 310 may be supplied with a voltage and may control an input and output of the charges of the floating gate 340. The control gate 310 may include a conductive material, such as a metal, a metal nitride, or a combination of a metal and metal nitride. Although not shown, the control gate 310 may encircle an outer sidewall of the charge blocking layer 350, and may have a line shape extending in a horizontal direction with respect to the orientation of FIG. 5.

The synapse may include a vertical-type transistor, which includes a channel extending in a direction that is perpendicular to an underlying substrate. When the vertical-type transistor is used as a synapse, the synapse may be fabricated without using an underlying semiconductor substrate. Thus, the semiconductor substrate may be used in fabricating other elements of the neuromorphic device, and thus a degree of integration of the neuromorphic device may be efficiently improved.

In another embodiment, the synapse may include a planar-type transistor, which includes a channel extending in a direction parallel to a substrate. The planar-type transistor may include a tunnel insulating layer, a floating gate, a charge blocking layer, and a control gate, which are sequentially stacked over a semiconductor substrate.

FIGS. 6A to 9B are views illustrating a method for fabricating a neuromorphic device according to an embodiment. FIGS. 6A, 7A, 8A, and 9A show planar views, and each of FIGS. 6B, 7B, 8B, and 9B shows a cross-sectional view taken along a line A-A' of a corresponding one of FIGS. 6A, 7A, 8A, and 9A. The neuromorphic device of this embodiment may include a synapse having a vertical-type transistor, such as the synapse shown in FIG. 5.

Figure 6A:
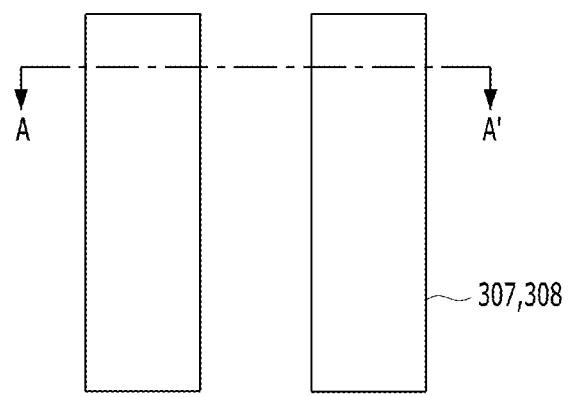
FIGS. 6A to 9B are views illustrating a method for fabricating a neuromorphic device according to an embodiment.
Figure 6B:
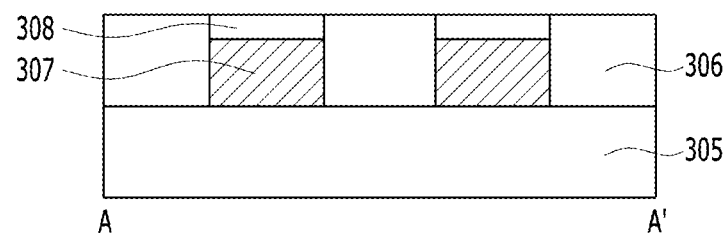

Referring to FIGS. 6A and 6B, a substrate 305, in which a certain lower structure (not shown) is formed, may be provided.

Then, a lower line 307 extending in a first direction, for example, a longitudinal direction, may be formed over the substrate 305. The lower line 307 may provide a voltage to one junction of a transistor and may correspond to one of the additional row lines 420 or one of the column lines 220 of FIGS. 2A to 3. When the lower line 307 corresponds to one of the column lines 220 of FIGS. 2A to 3, the lower line 307 may be coupled to a source region of the transistor. The lower line 307 may include any of various conductive materials. The conductive materials may include a metal such as W or Cu, a metal nitride, and a combination of a metal and a metal nitride. In the embodiment of FIGS. 6A and 6B, two lower lines 307, which are separated from each other in a second direction crossing the first direction, are shown. However, in other embodiments, the number of the lower lines 307 may be variously modified.

Also, a source region 308 overlapping the lower line 307 may be formed over the lower line 307. The source region 308 may include a semiconductor material having an impurity with a first conductivity type. For example, the source region 308 may include an N-type polysilicon. However, if the lower line 307 corresponds to the additional row line 420 of FIGS. 2A to 3, which provides a voltage to a drain region of the transistor, the source region 308 may instead be replaced with the drain region. The drain region may include a semiconductor material including an impurity having the same conductivity type as the source region 308.

A first interlayer insulating layer 306 may be fill a space between first stack structures, each including the lower line 307 and the source region 308. The first interlayer insulating layer 306 may include an insulating material, such as a silicon oxide.

The lower line 307, the source region 308, and the first interlayer insulating layer 306 may be formed by the following method.

As an example, the first stack structure including the lower line 307 and the source region 308 may be formed by sequentially depositing a metal-containing material and a semiconductor material over the substrate 305, and selectively etching the metal-containing material and the semiconductor material. The metal-containing material may be used to form the lower line 307, and the semiconductor material may be used to form the source region 308. Specifically, the semiconductor material may include an impurity with a first conductivity type. The first stack structure, which includes the lower line 307 and the source region 308, may be formed when the metal-containing material and the semiconductor material are selectively etched. Then, an insulating material covering a resultant structure including the first stack structure may be deposited, and a planarization process, for example, a CMP (Chemical Mechanical Polishing) process may be performed until a top surface of the source region 308 is exposed.

Alternatively, in another example, the first interlayer insulating layer 306 may be formed by depositing an insulating material over the substrate 305 and selectively etching the insulating material to provide a space in which the lower line 307 and the source region 308 of the first stack structure are to be formed. Then, the lower line 307 and the source region 308 of the first stack structure may be formed by sequentially depositing a metal-containing material and a semiconductor material, respectively, within the space.

Figure 7A:
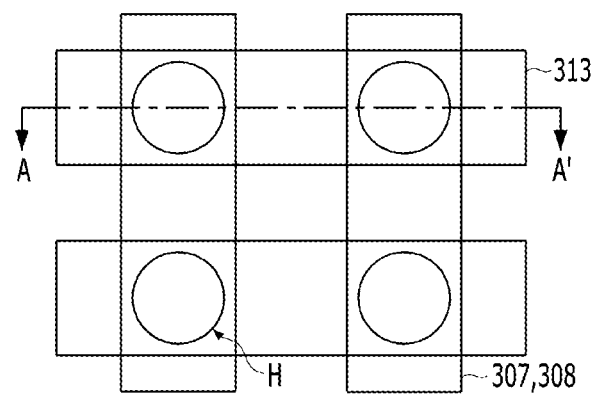
Figure 7B:
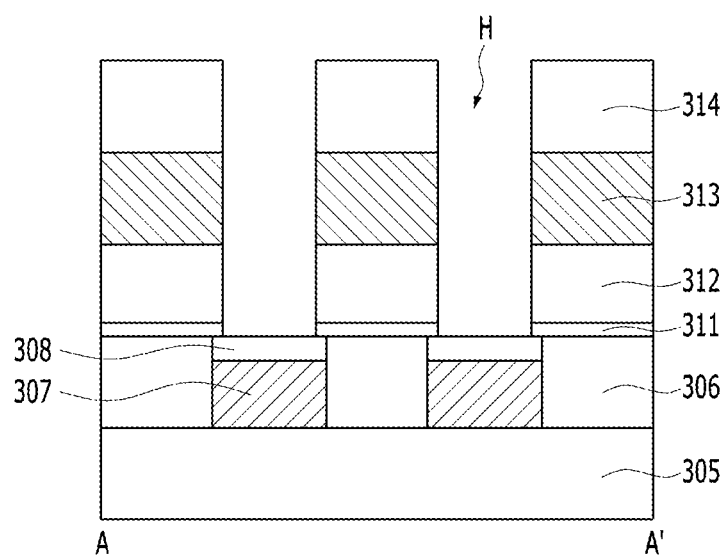

Referring to FIGS. 7A and 7B, a second stack structure, including an etch stop layer 311, a second interlayer insulating layer 312, a control gate layer 313, and a third interlayer insulating layer 314, may be formed over a resultant structure of FIGS. 6A and 6B.

The second stack structure may be formed by sequentially depositing and then selectively etching an insulating material, such as a silicon nitride, for forming the etch stop layer 311; an insulating material, such as a silicon oxide, for forming the second interlayer insulating layer 312; a conductive material, such as a metal, for forming the control gate layer 313; and an insulating material, such as a silicon oxide, for forming the third interlayer insulating layer 314. In this embodiment, the second stack structure may extend in the second direction that crosses the first direction and the lower line 307 and the source region 308 of the first stack structure. However, in another embodiment, if the lower line 307 corresponds to the additional row line 420 of FIGS. 2A to 3, and provides a voltage to the drain region of the transistor, the second stack structure may extend in the first direction and may overlap the lower line 307 and the source region 308 of the first stack structure. A plurality of second stack structures, each including the etch stop layer 311, the second interlayer insulating layer 312, the control gate layer 313, and the third interlayer insulating layer 314, may be spaced apart from each other in the first direction, and a space between the plurality of second stack structures may be filled with an insulating material (not shown). The control gate layer 313 extending in the second direction may correspond to the row line 120 of FIGS. 2A to 3.

Then, the second stack structure may be selectively etched to form a hole H exposing the source region 308. The hole H may overlap an intersection region between the second stack structure and the first stack structure. When the hole H is being formed, the etching process may be stopped when the etch stop layer 311 is exposed, and then the exposed etch stop layer 311 may be removed using a different process from the etching process to expose the source region 308. Accordingly, an attack on the source region 308 may be prevented compared to a case in which the etch stop layer 311 is also removed in the etching process. In an embodiment, when the etching process is a dry etch process, the different process may be a wet etch process.

Figure 8A:
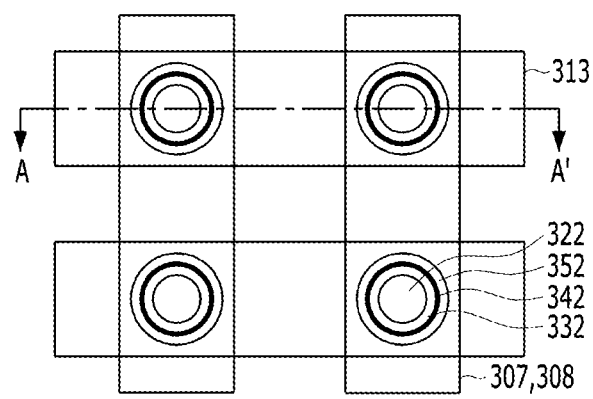
Figure 8B:
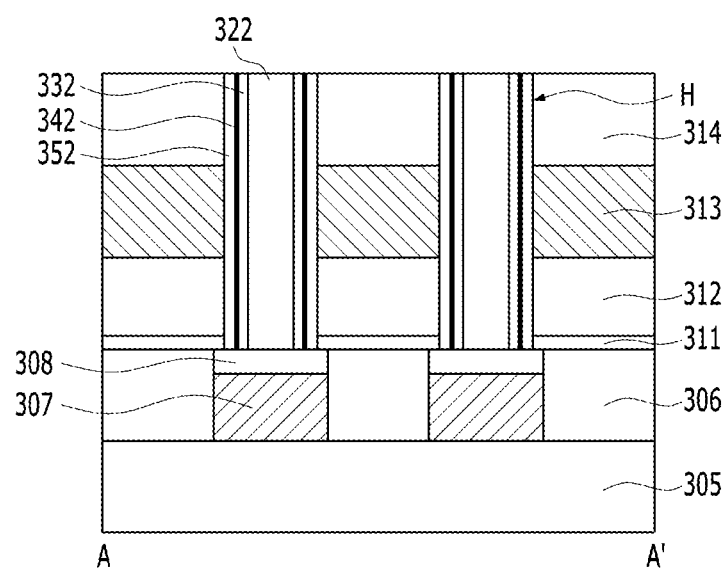

Referring to FIGS. 8A and 8B, a charge blocking layer 352, a floating gate layer 342, and a tunnel insulating layer 332 may be sequentially formed over a sidewall of the hole H. Then, a semiconductor pillar 322 filling a remaining space of the hole H may be formed.

The charge blocking layer 352, the floating gate layer 342, and the tunnel insulating layer 332 may be formed by sequentially depositing a charge blocking material, a floating gate material, and a tunnel insulating material, respectively, on the resultant structure including the hole H. A total thickness of the charge blocking layer 352, the floating gate layer 342, and the tunnel insulating layer 332 may be thinner than the hole H, such that the hole H is not completely filled. That is, the total thickness may be thinner than a radius of the hole H. A blanket etching process is applied to the charge blocking material, the floating gate material, and the tunnel insulating material to form the charge blocking layer 352, the floating gate layer 342, and the tunnel insulating layer 332 on the sidewall of the hole H.

Alternatively, the charge blocking layer 352, the floating gate layer 342 and the tunnel insulating layer 332 may be formed by performing a deposition and blanket etch process of a charge blocking material, performing a deposition and blanket etch process of a floating gate material, and performing a deposition and blanket etch process of a tunnel insulating material.

The semiconductor pillar 322 may be formed by depositing a semiconductor material in the hole H, and then performing a planarization process until a top surface of the third interlayer insulating layer 314 is exposed. The semiconductor pillar 322 may be deposited at a thickness sufficient to fill the remaining space of the hole H when the hole H is partially filled with the charge blocking layer 352, the floating gate layer 342, and the tunnel insulating layer 332.

As a result, a vertical-type transistor including the semiconductor pillar 322 as well as the tunnel insulating layer 332, the floating gate layer 342, the charge blocking layer 352, and the control gate layer 313, which encircle the semiconductor pillar 322, may be formed.

Meanwhile, although not shown, after the hole H of FIGS. 7A and 7B and/or the tunnel insulating layer 332, the floating gate layer 342 and the charge blocking layer 352 of FIGS. 8A and 8B are formed, an additional impurity implantation process may be performed on the exposed source region 308 in order to compensate for impurity losses in the source region 308. The impurity in the source region 308 may be an N-type impurity.

Also, although not shown, after the semiconductor pillar 322 of FIGS. 8A and 8B has been formed, an additional impurity implantation process may be performed on an upper portion of the semiconductor pillar 322 in order to form the other junction region of the transistor, for example, a drain region of the transistor. This impurity implanted into the other junction region may be an N-type impurity.

Figure 9A:
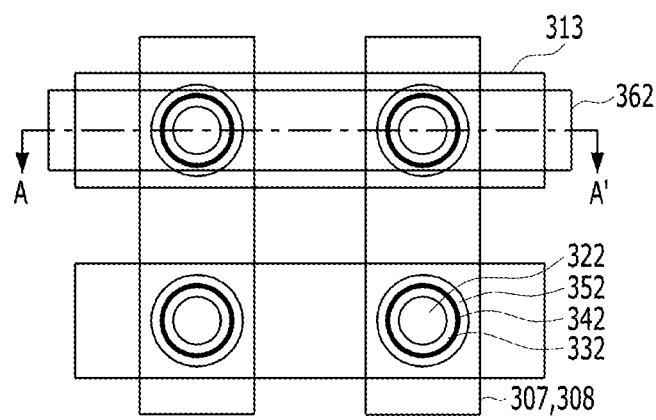
Figure 9B:
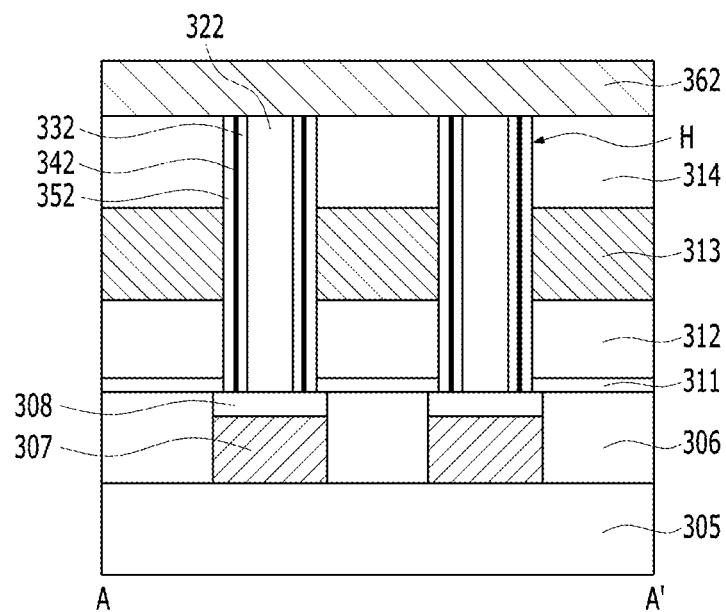

Referring to FIGS. 9A and 9B, an upper line 362 may be formed over the resultant structure shown by FIGS. 8A and 8B. The upper line 362 may provide a voltage to the other junction of the transistor. When the lower line 307 corresponds to one of the additional row lines 420 of FIGS. 2A to 3, the upper line 362 may correspond to one of the column lines 220 of FIGS. 2A to 3, or vice versa. In an embodiment in which the lower line 307 corresponds to one of the column lines 220 of FIGS. 2A to 3 and the upper line 362 corresponds to one of the additional row lines 420 of FIGS. 2A to 3, the upper line 362 may overlap the control gate layer 313 and may extend in the same direction as the extending direction of the control gate layer 313. The upper line 362 may include any of various conductive materials. The conductive materials may include a metal such as W or Cu, a metal nitride, and a combination of a metal and a metal nitride. The upper line 362 may be coupled to the drain region formed in the upper portion of the semiconductor pillar 322, and may provide a required voltage to the transistor.

Therefore, a neuromorphic device shown in FIGS. 9A and 9B may be provided. This neuromorphic device may correspond to an example of the neuromorphic devices depicted by FIGS. 2A to 3.

The neuromorphic device according to the above-described embodiments may be used in various devices or systems. This will be described by way of example with reference to FIG. 10.

Figure 10:
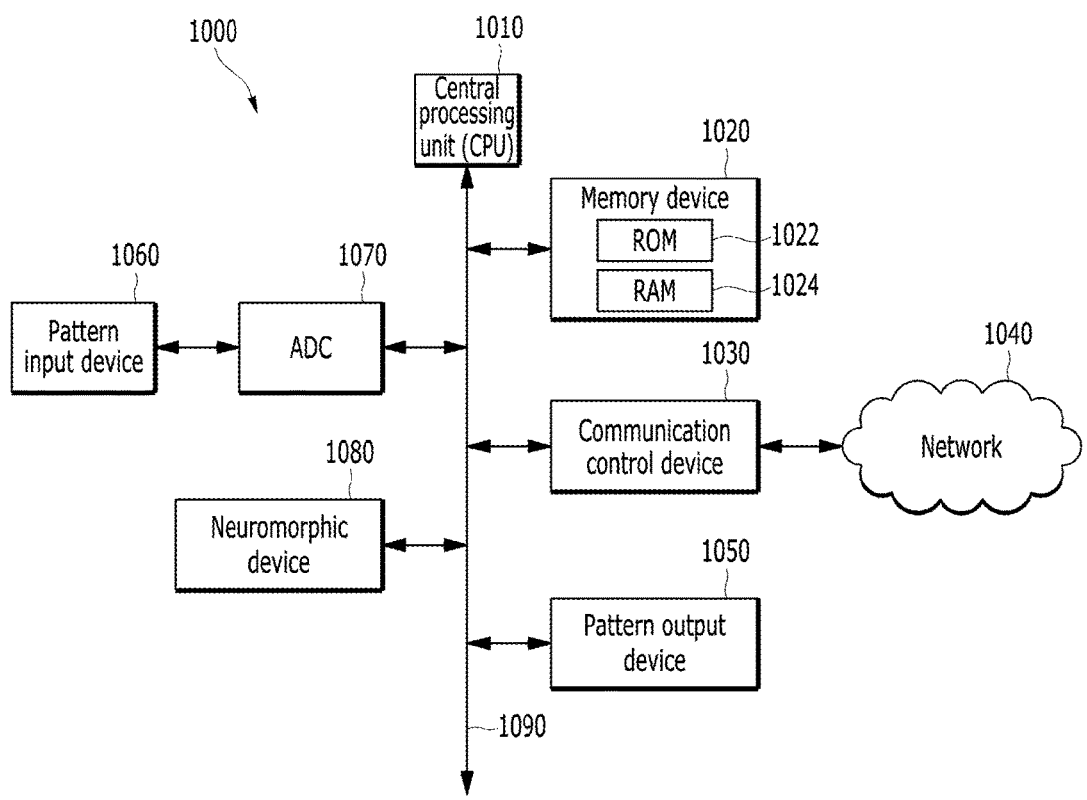
FIG. 10 shows a pattern recognition system according to an embodiment.

FIG. 10 shows a pattern recognition system 1000 according to an embodiment.

The pattern recognition system 1000 may be a system for recognizing various patterns, such as a speech recognition system or an image recognition system. The pattern recognition system 1000 may be configured with the neuromorphic device of the above-described embodiments.

Referring to FIG. 10, the pattern recognition system 1000 may include a central processing unit (CPU) 1010, a memory device 1020, a communication control device 1030, a pattern output device 1050, a pattern input device 1060, an analog-digital converter (ADC) 1070, a neuromorphic device 1080, a bus line 1090, and the like. The pattern recognition system 1000 is connected to a network 1040 through the communication control device 1030.

The central processing unit 1010 may generate and transmit various signals used in a learning operation performed by the neuromorphic device 1080, and may perform various processing operations for recognizing patterns of sound, images or the like based on an output of the neuromorphic device 1080. This central processing unit 1010 may be connected, via the bus line 1090, to the memory device 1020, the communication control device 1030, the pattern output device 1050, the analog-digital converter 1070, and the neuromorphic device 1080.

The memory device 1020 may store information in accordance with operations of the pattern recognition system 1000. For this, the memory device 1020 may include different memory devices. For example, the memory device 1020 may include a ROM device 1022, a RAM device 1024, and the like. The ROM device 1022 may store various programs or data which are used in the central processing unit 1010 in order to perform the learning operation of the neuromorphic device 1080, pattern recognition, etc. The RAM device 1024 may store the program or data downloaded from the ROM device 1022, or store data, such as sound or images, which have been converted or analyzed by the analog-digital converter 1070.

The communication control device 1030 may exchange recognized data (e.g., sound or images) with other communication control devices through the network 1040.

The pattern output device 1050 may output the recognized data (e.g., sound or images) in various manners. For example, the pattern output device 1050 may include one or more of a printer, a display unit, and the like, and may output sound waveforms or display images.

The pattern input device 1060 may receive analog-type sound, images, etc., and may include one or more of a microphone, a camera, etc.

The analog-digital converter 1070 may convert analog data, provided by the pattern input device 1060, to digital data, and may also analyze the digital data.

The neuromorphic device 1080 may perform learning, recognition, and the like using data provided by the analog-digital converter 1070, and may output data corresponding to recognized patterns. The neuromorphic device 1080 may include one or more neuromorphic devices that include synapses of the embodiments described above. For example, the neuromorphic device 1080 may include a plurality of row lines extending in a first direction; a plurality of additional row lines extending in the first direction; a plurality of column lines extending in a second direction that crosses the first direction; and a plurality of synapses positioned at intersections of the row lines, the additional row lines, and the column lines, wherein each of the synapses includes a transistor comprising a floating gate, a control gate insulated from the floating gate, a first junction, and a second junction, the control gate being coupled to a corresponding one of the plurality of row lines, the first junction being coupled to a corresponding one of the plurality of additional row lines, the second junction being coupled to a corresponding one of the plurality of column lines. By using this configuration, an accuracy of learning and recognition of the neuromorphic device may be improved. Accordingly, operating characteristics and accuracy of pattern recognition of the pattern recognition system 1000 may be improved.

The pattern recognition system 1000 may further include other components required for properly performing its function(s). For example, the pattern recognition system 1000 may further include one or more input devices such as a keyboard, a mouse, and the like, so as to receive various parameters and/or setting conditions for operations of the pattern recognition system 1000.

While the present invention has been described with respect to the specific embodiments, it will be apparent to those skilled in the art that various changes and modifications may be made without departing from the spirit and scope of the invention as defined in the following claims.

What is claimed is:

1. A method of learning a synapse having a transistor of a neuromorphic device comprising:
    applying a first signal to a row line, the row line being electrically connected to a gate of the transistor,
    applying a second signal to an additional row line, the additional row line being electrically connected to a drain of the transistor, and
    applying a third signal to a column line, the column line being electrically connected to a source of the transistor,
    wherein a first voltage difference between the first signal and the third signal is equal to or greater than a set voltage to change a threshold voltage of the transistor, and a second voltage difference between the second signal and the third signal is equal to or greater than the set voltage.

2. The method of claim 1, wherein the first signal and the second signal are voltage pulses.

3. The method of claim 1, wherein the third signal is 0V.

4. The method of claim 1, wherein magnitudes of the first signal and the second signal are equal to a magnitude of the set voltage.

5. A method of learning a neuromorphic device, wherein the neuromorphic device includes a first synapse and a second synapse,
    the first synapse including a first transistor having a first control gate, a first charge trap layer, a first source, and a first drain, and
    the second synapse including a second transistor having a second control gate, a second charge trap layer, a second source, and a second drain,
    wherein the method comprises:
    applying a first row voltage to a first row line, the first row line being electrically connected to the first control gate of the first transistor,
    applying a second row voltage to a second row line, the second row line being electrically connected to the second control gate of the second transistor,
    applying a first additional row voltage to a first additional row line, the first additional row line being electrically connected to the first drain of the first transistor,
    applying a second additional row voltage to a second additional row line, the second additional row line being electrically connected to the second drain of the second transistor,
    applying a first column voltage to a first column line, the first column line being electrically connected to the first source of the first transistor, and
    applying a second column voltage to a second column line, the second column line being electrically connected to the second source of the second transistor,
    wherein a first voltage difference between the first row voltage and the first column voltage is equal to or greater than a first set voltage to change a first threshold voltage of the first transistor, and
    wherein a second voltage difference between the first additional row voltage and the first column voltage is equal to or greater than the first set voltage.

6. The method of claim 5, wherein the first row voltage and the first additional voltage are voltage pulses.

7. The method of claim 5, wherein the first column voltage is 0V.

8. The method of claim 5, wherein magnitudes of the first row voltage and the first additional voltage are equal to a magnitude of the first set voltage.

9. The method of claim 5, wherein a third voltage difference between the second row voltage and the second column voltage is lower than a second set voltage to change a second threshold voltage of the second transistor.

10. The method of claim 9, wherein a fourth voltage difference between the second additional row voltage and the second column voltage is lower than the second set voltage.

11. A method of learning a neuromorphic device, wherein the neuromorphic device includes a first synapse to be learned and a second synapse not to be learned,
    the first synapse including a first transistor having a first control gate, a first charge trap layer, a first source, and a first drain, and
    the second synapse including a second transistor having a second control gate, a second charge trap layer, a second source, and a second drain, wherein the method comprises:

applying a first row voltage to a first row line, the first row line being electrically connected to the first control gate of the first transistor, applying a second row voltage to a second row line, the second row line being electrically connected to the second control gate of the second transistor, applying a first additional row voltage to a first additional row line, the first additional row line being electrically connected to the first drain of the first transistor, applying a second additional row voltage to a second additional row line, the second additional row line being electrically connected to the second drain of the second transistor, applying a first column voltage to a first column line, the first column line being electrically connected to the first source of the first transistor, and applying a second column voltage to a second column line, the second column line being electrically connected to the second source of the second transistor, wherein a first voltage difference between the first row voltage and the first column voltage is greater than a first set voltage to change a first threshold voltage of the first transistor, and wherein a second voltage difference between the second row voltage and the second column voltage is lower than a second set voltage to change a second threshold voltage of the second transistor.

12. The method of claim 11, wherein a third voltage difference between the first additional row voltage and the first column voltage is greater than the first set voltage.

13. The method of claim 12, wherein a fourth voltage difference between the second additional row voltage and the second column voltage is lower than the second set voltage.

* * * * *